(12) United States Patent
Gaboury

(10) Patent No.: US 7,142,005 B1
(45) Date of Patent: Nov. 28, 2006

(54) METHOD AND APPARATUS FOR A REFERENCE CLOCK BUFFER SYSTEM

(75) Inventor: Michael J. Gaboury, Burnsville, MN (US)

(73) Assignee: Xilinx, Inc., San Jose, CA (US)

( * ) Notice: Subject to any disclaimer, the term of this patent is extended or adjusted under 35 U.S.C. 154(b) by 418 days.

(21) Appl. No.: 10/723,866

(22) Filed: Nov. 26, 2003

(51) Int. Cl.
*H03K 17/16* (2006.01)
*G06G 7/12* (2006.01)
*H03F 3/45* (2006.01)

(52) U.S. Cl. .......................... 326/21; 326/26; 326/32; 327/379; 327/563; 330/256; 330/257; 330/261

(58) Field of Classification Search ........ 368/113–120; 326/21–27, 32; 330/255–257, 266–267, 330/261; 327/379, 563
See application file for complete search history.

(56) References Cited

U.S. PATENT DOCUMENTS

| | | | | |
|---|---|---|---|---|
| 5,021,684 A | * | 6/1991 | Ahuja et al. ................ | 326/27 |
| 6,051,995 A | * | 4/2000 | Pollachek .................... | 326/87 |
| 6,160,416 A | * | 12/2000 | Adduci et al. ............... | 326/21 |
| 6,297,699 B1 | * | 10/2001 | Murray et al. .............. | 330/267 |
| 6,433,637 B1 | * | 8/2002 | Sauer ......................... | 330/255 |
| 6,437,628 B1 | * | 8/2002 | Davenport et al. ......... | 327/333 |
| 6,801,080 B1 | * | 10/2004 | Arcus .......................... | 327/563 |
| 6,870,391 B1 | * | 3/2005 | Sharpe-Geisler ............. | 326/37 |
| 6,914,486 B1 | * | 7/2005 | Varner et al. ............... | 330/267 |
| 2005/0012552 A1 | * | 1/2005 | Varner et al. ............... | 330/267 |

* cited by examiner

*Primary Examiner*—Vit W. Miska
(74) *Attorney, Agent, or Firm*—LeRoy D. Maunu; Michael Wallace

(57) ABSTRACT

According to one example embodiment, a buffer, e.g., in a clock/signal distribution apparatus is provided that substantially reduces jitter due to power supply noise. Decoupler and input stage isolates load from the top rail power supply ($V_{DD}$). In a more particular embodiment, jitter contributions from the bottom rail power supply ($V_{SS}$) can be minimized by cross-coupled load devices within load. Substantial independence from process and temperature is facilitated through the use of current bias, such as Proportional to Absolute Temperature (PTAT) current bias.

16 Claims, 5 Drawing Sheets

METHOD AND APPARATUS FOR A REFERENCE CLOCK BUFFER SYSTEM

FIELD OF THE INVENTION

The present invention generally relates to clock buffers, and more particularly to high performance clock buffers that reduce jitter noise injected from the power supply.

BACKGROUND

The communication age and its appetite for increased data throughput continues to force high bandwidth designs. Technologies such as telecommunications and networking, for example, continue to fuel research and design efforts that facilitate serial data rate capabilities on the order of hundreds of gigabits per second and higher.

As the data rate capability increases, other design specifications, such as clock jitter and propagation delay, constrains the circuit designer in regard to the maximum data rate that is achievable. As the data rate increases, for example, the total jitter budget for a particular design decreases. An Optical Carrier (OC)-192 compliant transceiver, for example, having a data rate capability of 10 gigabits per second (Gbps) is allowed less than 1 picosecond (ps) of total jitter due to random noise, i.e., root mean square (rms), jitter. Further, only 10 ps is allowed for deterministic jitter. Therefore, predicting and reducing jitter induced via power supply and other sources of random noise becomes important in most applications.

High performance clock buffers are often used in communication designs for duplication, distribution, and fan-out of clock signals. Sensitivity to clock jitter is a concern in these applications. In many applications, errors resulting from the accumulation of jitter can significantly interfere with system performance and reliability.

Accumulated jitter has profound effects on systems that employ a single clock that is distributed, or fanned out, over many distribution paths, e.g., clock distribution networks. Fundamental knowledge of the requirements of each branch of a given clock tree design, therefore, can be important in understanding which type of device will perform well in a particular design or application.

Specifically, a detailed understanding of the frequency requirements of each clock branch, phase relationships between each clock branch and the reference clock, and phase relationships between each clock branch and every other clock branch is required. Accuracy requirements of the distributed clock signals for both the short term, e.g., cycle to cycle, and long term, e.g., accumulated over n cycles, should be known. Load and termination of the transmission lines used to propagate the clock signals can also be important in the preservation of waveform integrity.

A primary source of jitter is power supply noise. Power supply noise that exists, for example, at the power supply input of a Phase Locked Loop (PLL) will appear on the output of the PLL as jitter. Power supply induced jitter can be a substantial, though not always constant, contributor to jitter.

Power supply noise manifests itself in various ways, both on the top rail and bottom rail power supplies. An inverter operating from a top rail power supply, for example, may have a threshold voltage equal to half of the top rail power supply magnitude. If the top rail power supply contains a voltage ripple component, then the voltage ripple component causes a shift in the threshold voltage at the input to the inverter, which translates into jitter.

Alternately, bottom rail power supply manifestation of jitter may be caused by ground bounce. When there is a surge of current through the output drivers, for example, the inductance of the leads to the supply planes, e.g., $V_{DD}$ and $V_{SS}$, have a voltage drop across them that is equal to the product of the inductance of the leads and the derivative of the current surge with respect to time. This raises or lowers the effective bottom rail potential of the device. Series resistance may also be a factor when considering finer geometry processes.

Hence, if the device has an output whose frequency is dependent upon supply voltage, e.g., a Voltage Controlled Oscillator (VCO), the frequency will change due to ground bounce. Additionally, any transistors operating within the device experiences a change in threshold voltage, which may also cause a frequency change. Further, if the device is providing an input to a PLL, then the PLL attempts to correct the frequency change, thus further contributing to jitter at its output.

Requirements such as power supply levels, input and output transition times, and circuit board layout often constrain the design of buffer circuits. It is not typically cost effective, however, to design a buffer circuit for each particular application, which may require specialized power supply regulation. It is desirable, rather, to design a buffer circuit that may be effective in a number of applications having varying speed and process requirements, as well as unknown system parameters, such as power supply noise characteristics. A need exists, therefore, for a buffer circuit that minimizes power supply contribution to jitter, while negating the need for customized power supply regulation.

An apparatus and method that addresses the aforementioned problems, as well as other related problems, are therefore desirable.

SUMMARY OF THE INVENTION

The present invention is directed to a buffer circuit that addresses the aforementioned problems for those and other applications.

In one embodiment, a buffer includes a current source coupled to provide a current signal substantially independent of temperature variations. The buffer further includes a bias circuit adapted to provide a first bias signal in response to the current signal. The buffer further comprises a decoupler, responsive to the first bias signal and a first power supply signal. Said decoupler is adapted to provide a load signal that is independent of noise present in the first power signal. The buffer also includes an input stage coupled to receive the load signal as its supply reference, and is adapted to provide an output signal that is independent of the noise in the first power signal and the aforementioned temperature variations.

In another embodiment, a buffer circuit includes means for generating a bias signal whose magnitude is substantially independent of temperature, and a means for generating a load signal, whose magnitude is substantially independent of a first power supply signal, and whose signal strength is in ratio proportion to the bias signal. The buffer circuit further includes means for generating an output signal from the load signal in response to an input signal, the means for generating said output signal being referenced to a second power supply signal. The buffer circuit further includes means for detecting a first phase of the output signal to accelerate a transition of a second phase of the output signal.

According to another embodiment, in a clock distribution system, a buffer is adapted to operate substantially independent of its environment by deriving temperature independent bias signals from a first power supply having a first level and a second power supply having a second level different from the first level. The buffer substantially reduces power-supply, noise-induced jitter on an output signal of the buffer. The buffer comprising a current generator adapted to generate a current bias substantially independent of temperature variation. The current generator includes a voltage source coupled to the first power supply to provide a voltage signal.

In accordance with yet another and aspects of the present invention and useful with one of the above embodiments, the load circuit includes a cross coupled circuit coupled to the first and second nodes, wherein the cross coupled circuit decreases a negative transition time of the output signal at the first node in response to an increased conductivity state of the cross coupled circuit caused by the output signal at the second node.

The above summary of the present invention is not intended to describe each embodiment or every implementation of the present invention. Advantages and attainments, together with a more complete understanding of the invention, will become apparent and appreciated by referring to the following detailed description and claims taken in conjunction with the accompanying drawings.

BRIEF DESCRIPTION OF THE DRAWINGS

Various aspects and advantages of the invention will become apparent upon review of the following detailed description and upon reference to the drawings in which.

DETAILED DESCRIPTION

Various embodiments of the present invention are described in terms of buffer circuits that minimize the jitter contribution of the power supply. Embodiments of buffer circuits used to propagate a signal are shown using complimentary P-type Field Effect Transistors (PFET) and N-type (NFET) topologies. Those skilled in the art will appreciate that the invention could be implemented in other circuit topologies such as bipolar or bipolar-Complimentary Metal Oxide (biCMOS) circuit topologies.

Jitter may be defined as the deviation in a signal's actual transition in time from its ideal position in time, the signal's actual transition may either lag or lead the ideal position in time. Jitter may be classified into three categories: cycle to cycle jitter, period jitter, and long term jitter.

Figure 1:
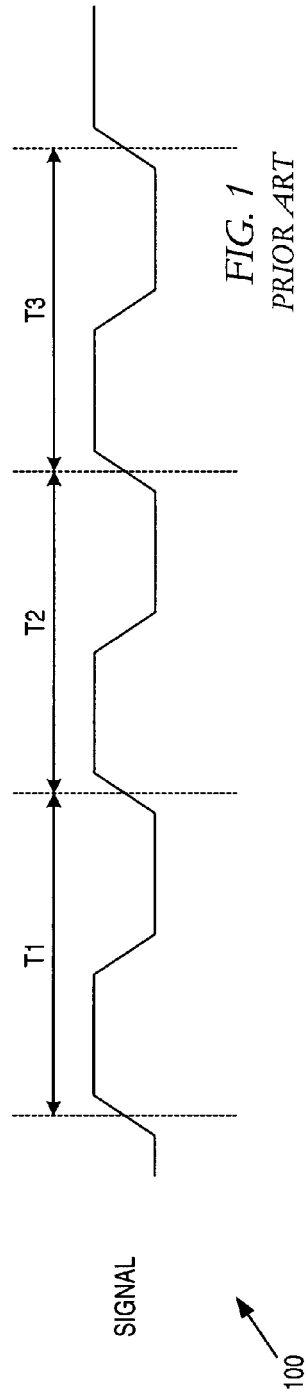
FIG. 1 illustrates a prior art waveform exhibiting cycle to cycle jitter.

Cycle to cycle jitter is the change in a signal's output transition from its corresponding position in the previous cycle as shown in FIG. 1. The total amount of cycle to cycle jitter, J1, experienced by the signal 100 is measured as the difference between period T1 and period T2, such that J1=T2−T1. The total amount of jitter, J2, experienced by signal 100 is measured as the difference between period T2 and T3, such that J2=T3−T2.

Figure 2:
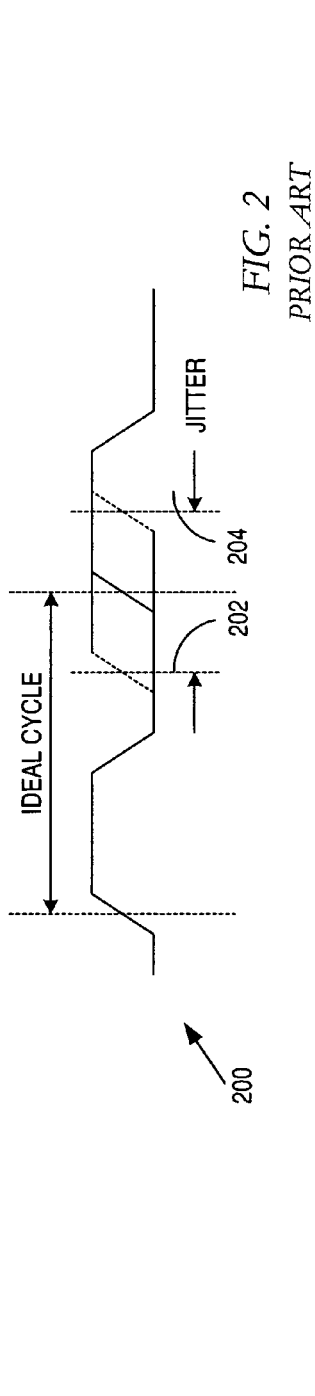
FIG. 2 illustrates a prior art waveform exhibiting period jitter.

Period jitter is illustrated by waveform 200 of FIG. 2. Period jitter measures the maximum change in a signal's output transition from its ideal position. The time difference between lagging rising edge 204 and leading rising edge 202, for example, provides the amount of period jitter experienced by waveform 200. Period jitter measurements are used to calculate timing margins in systems.

Figure 3:
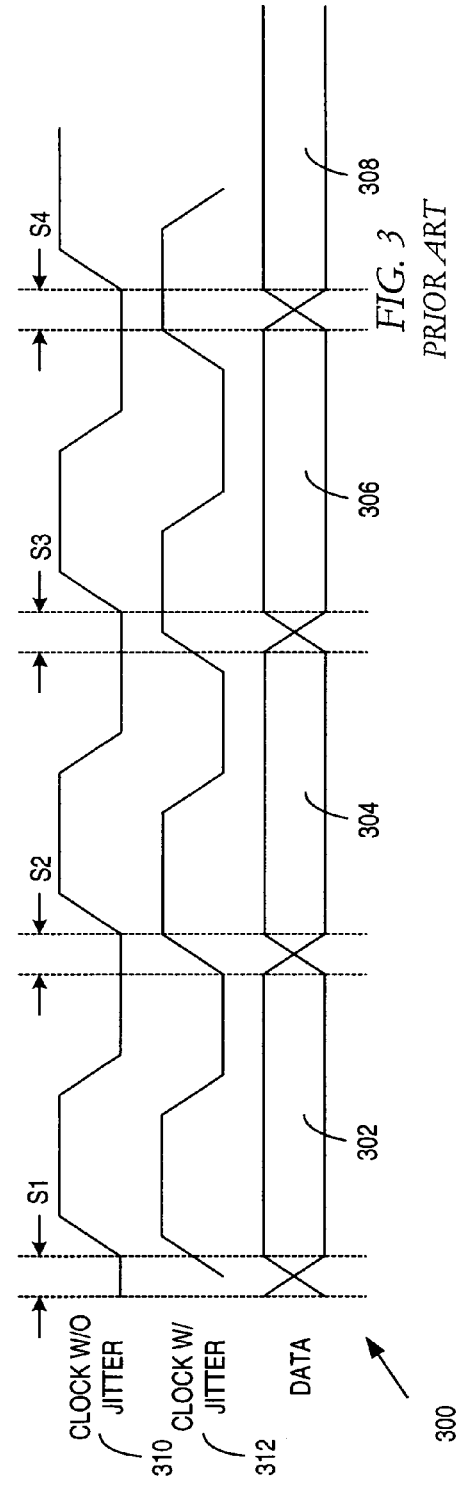
FIG. 3 illustrates prior art waveforms exhibiting differences between a clock waveform with and without jitter.

With reference to timing waveforms 300 of FIG. 3, for example, data values 302–308 and associated setup times, S1–S4, are always in proper phase alignment with the clock signal experiencing no jitter, e.g., 310. That is to say, that the required setup times for data signals 302–308 is always met before the rising edge of clock 310 occurs. Clock signal with jitter, e.g., 312, however, violates the required amount of setup time for each of setup times S1–S3.

In particular, clock signal 312 continues to increasingly lead signal DATA such that the rising edges of clock signal 312 occurs at some point during or before the required setup times S1–S3. In such instances, the output of the device (not shown) receiving data signals 302–306 and clock signal 312 is indeterminate. Further with respect to data signal 308, the output of the device actually reflects the value of data signal 306, due to the excessive advanced placement of clock signal 312 due to jitter.

Figure 4:
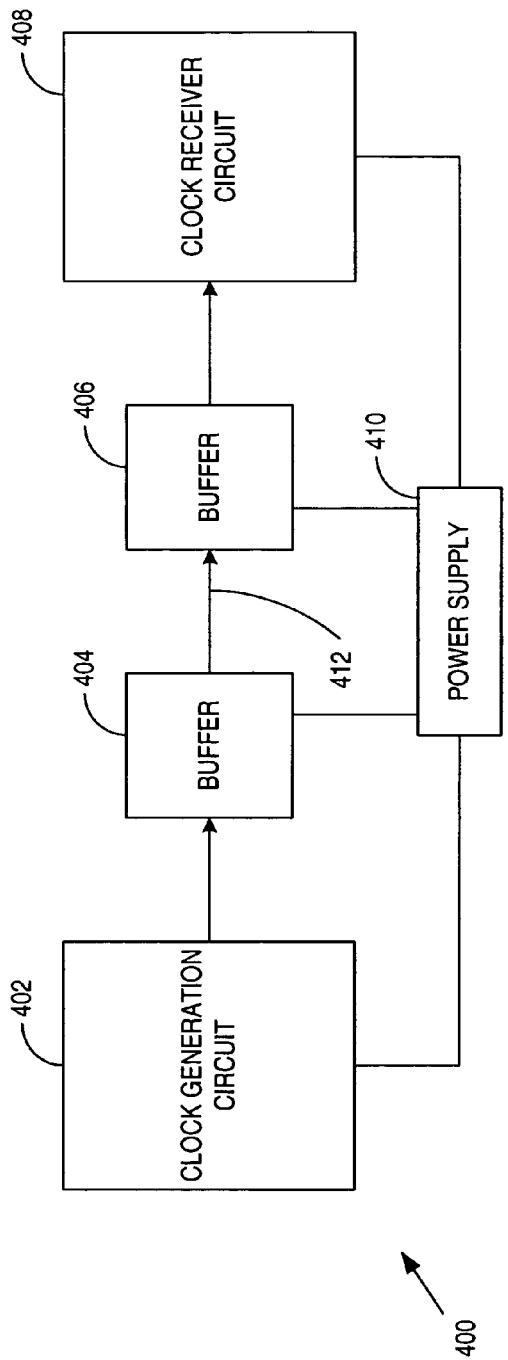
FIG. 4 illustrates an exemplary clock distribution system in accordance with various embodiments of the invention.

FIG. 4 represents exemplary clock distribution system 400 in accordance with various embodiments of the invention. Generally, clock generation circuit 402 supplies a clock signal to buffer 404, which receives and buffers the clock signal prior to transmitting the clock signal to buffer 406 via channel 412. Clock receiver circuit 408 then receives the buffered clock signal from buffer 406. Buffers 404 and 406 may be equivalent, whereby both buffers substantially eliminate jitter caused by noise from power supply 410.

Clock generation circuit 402 and clock receiver circuit 408 may represent any electronic module/circuit that transmits and receives clock signals, respectively. Clock generation circuit 402, for example, may represent a frequency synthesizer having one or more internal phase locked loops to maintain phase and frequency coherency with a fixed reference input signal. Clock receiver circuit 408, for example, may represent an additional frequency synthesizer used to further translate the clock signal from frequency synthesizer 402.

Buffers 404 and 406 operate to reduce jitter noise normally injected from power supply 410. Buffer 404 accepts a wide range of input voltage levels from clock generation circuit 402 and produces a substantially fixed output. The output of buffer 404 may then be used to drive channel 412, which may represent a signal trace on a printed circuit board exhibiting transmission line characteristics, e.g., line loss due to distributed inductance and capacitance. Buffer 406 also accepts a wide range of input voltages and may also drive a similar channel that is terminated by clock receiver circuit 408. Buffer 406 insures that the clock signal characteristics are within the specification range of clock receiver circuit 408.

Buffers 404 and 406 operate to decouple power supply 410 from the clock signal data path through the use of, among other features, a PMOS differential pair coupled to the top rail power supply. The PMOS differential pair is constructed with thick gate oxide allowing functionality from the high voltage, top rail power supply. The PMOS differential pair further utilizes active load devices having thinner gate oxide relative to the PMOS differential pair, in order to satisfy the high speed requirements of buffers 404 and 406.

The load devices are biased in the linear region to act as voltage controlled resistive elements. Accordingly, the need to use passive devices, such as resistors, is obviated, thus realizing an arrangement that substantially reduces the process variations between MOSFET and passive devices. Typically in a new design, for example, the resistor models are not as refined or accurate as the MOS device models. Therefore, a design without resistors yields a more robust design in the early stages of development because simulations predicting circuit performance are more accurate.

In addition, a pair of cross-coupled load devices are implemented within buffers 404 and 406 to speed up the negative transitions of the output signals, which has the advantage of minimizing the jitter noise contribution of the bottom rail power supply. Clamping circuitry is added to the active load devices of buffers 404 and 406, to prevent destructive voltage levels from being applied to the thin oxide, active load devices.

It should be noted that an advantage of buffers 404 and 406 exists such that they may be designed into a multitude of circuit applications regardless of, for example, physical die location. In particular, if the buffer circuit is instantiated in the upper right hand corner and the lower left hand corner of a large die, then the buffer circuit exhibits substantial independence of performance variation due to the physical die location of the buffer circuit. In order to gain this independence, bias circuitry is added to buffers 404 and 406 to insure that a bias current is generated that is substantially independent of die location, nominal power supply variation, and temperature. Further, the bias circuit is configured to insure substantially unconditional startup in any power on configuration.

Figure 5:
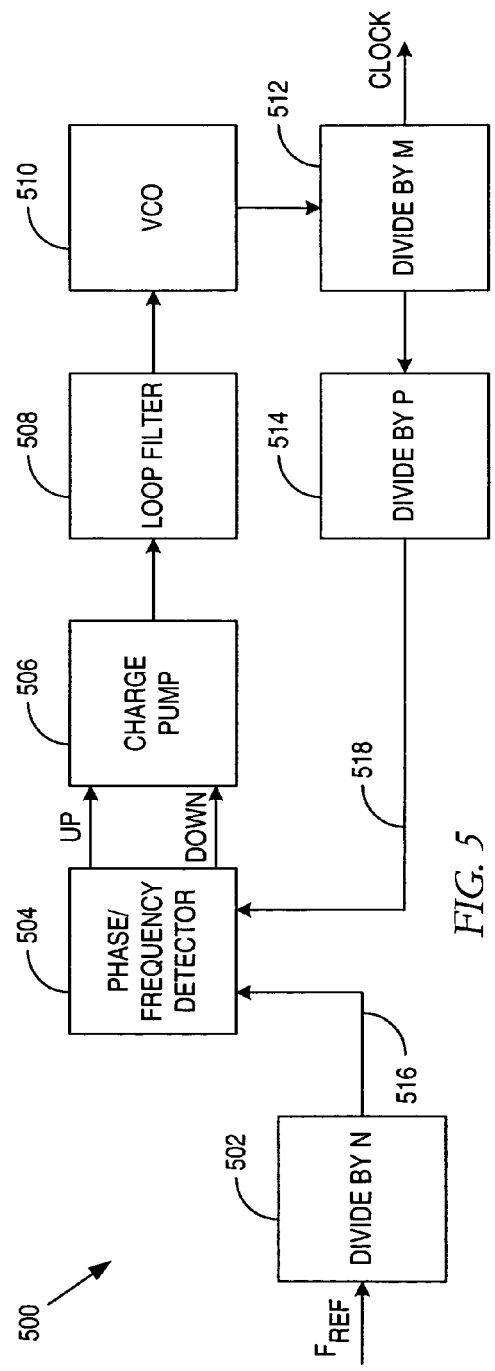
FIG. 5 illustrates a Phase Locked Loop based frequency synthesizer.

In an exemplary system application, clock generation circuit 402 is implemented using PLL based frequency synthesizer 500 of FIG. 5. Phase/frequency detector 504 receives two signals: a divided version of the reference frequency, $F_{REF}/N$, via path 516 from divide-by-N 502; and a divided version of the VCO frequency, $F_{VCO}/(M*P)$, via path 518 from divide-by-P 514. The operation of phase/frequency detector 504 compares the frequency and phase of signals 516 and 518 and provides error signals, UP and DOWN, in response to the comparison.

Coarse adjustments are made by phase/frequency detector 504 in relation to the frequency difference between the signals on path 516 and 518. If, for example, the frequency of signal 516 is higher than the frequency of signal 518, then signal UP is in a dominate active state with respect to signal DOWN, e.g., the pulse width of signal UP is wider than the pulse width of signal DOWN. In such an instance, charge pump 506 reacts to the dominant UP signal by increasing its output control current. Loop filter 508 integrates the increasing control current to provide a larger control voltage to VCO 510. In response to the increased control voltage, VCO 510 generates a higher frequency signal to divide-by-M 512 and ultimately a higher frequency signal 518 to phase/frequency detector 504. The UP signal continues to dominate the DOWN signal until the frequencies of signals 516 and 518 are substantially equal.

If, on the other hand, the frequency of signal 516 is lower than the frequency of signal 518, then signal DOWN is in a dominate active state with respect to signal UP, e.g., the pulse width of signal DOWN is wider than the pulse width of signal UP. In such an instance, charge pump 506 reacts to the dominant DOWN signal by decreasing its output control current. Loop filter 508 integrates the decreasing control current to provide a smaller control voltage to VCO 510. In response to the decreased control voltage, VCO 510 generates a lower frequency signal to divide-by-M 512 and ultimately a lower frequency signal 518 to phase/frequency detector 504. The DOWN signal continues to dominate the UP signal until the frequencies of signals 516 and 518 are substantially equal.

Fine adjustments are similarly made by phase/frequency detector 504 in relation to the phase difference between signals 516 and 518. If, for example, the phase of signal 518 lags the phase of signal 516, then the active state of signal UP dominates the active state of signal DOWN, which serves to advance the phase of signal 518 with respect to the phase of signal 516 through feedback generated by charge pump 506, loop filter 508, VCO 510, divide-by-M 512, and divide-by-P 514 as discussed above.

If, on the other hand, the phase of signal 518 leads the phase of signal 516, then the active state of signal DOWN dominates the active state of signal UP, which serves to retard the phase of signal 518 with respect to the phase of signal 516 through feedback generated by charge pump 506, loop filter 508, VCO 510, divide-by-M 512, and divide-by-P 514 as discussed above.

Thus, PLL based frequency synthesizer 500 tracks both the frequency and phase of reference signal $F_{REF}$ to create signal CLOCK, which is in a phase coherent relationship with signal $F_{REF}$. The frequency of signal CLOCK is proportionate to signal $F_{REF}$ as follows:

$F_{CLOCK} = F_{REF}*(M*P/N)$, where $F_{CLOCK}$ is the frequency of signal CLOCK, P is the dividing ratio of divide-by-P 514 and N is the dividing ratio of divide-by-N 502.

Clock receiver circuit 408 may also be implemented using PLL based frequency synthesizer 500. In such an instance, clock receiver circuit receives signal CLOCK from clock generation circuit 402 via buffer 404 and buffer 406. Clock receiver circuit 408 then provides a second clock signal that is both phase and frequency coherent with signal CLOCK as discussed above.

In order to exemplify a particular implementation of clock distribution system 400, a microprocessor based system is now examined. A particular microprocessor based system may employ clock distribution system 400, such that clock generation circuit 402 receives a reference clock from a crystal oscillator, for example, and then multiplies the crystal oscillator frequency by a factor of 2, for example. In such an instance, divide-by-N 502 receives the crystal oscillator signal, $F_{REF}$, and doubles the oscillator's frequency by using a divide ratio of $N=1/2$. Appropriate divide ratios, M and P, are then employed as discussed above such that $F_{CLOCK}=2*F_{REF}$.

Signal CLOCK is then received by buffers 404 and 406, and subsequently transmitted to clock receiver circuit 408, e.g., a microprocessor. Internal to the microprocessor, for example, an additional PLL may exist, such that signal CLOCK may be multiplied by an integer multiple using the appropriate divide by ratios as discussed above.

It can be seen that timing problems with the microprocessor based distribution system can develop if the jitter of any of the clock stages, e.g., 402, 404, or 406, exceeds the maximum slew rate limit for the following PLL multiplier circuit. The slew rate is defined to be the instantaneous difference of period between adjacent clock cycles, or cycle to cycle jitter, as discussed above in relation to FIG. 1.

Figure 6:
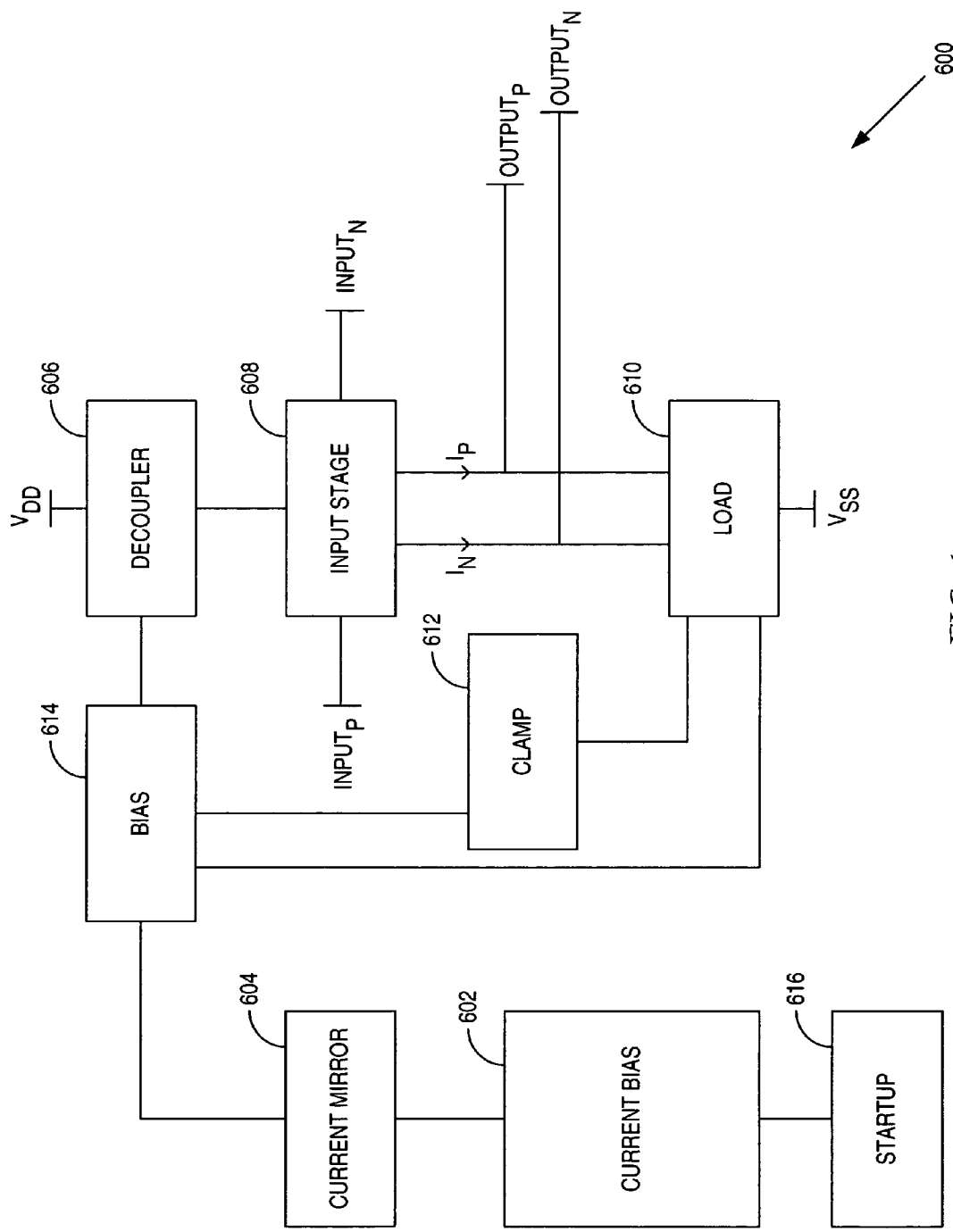
FIG. 6 illustrates a block diagram of a buffer in accordance with various embodiments of the invention.

An exemplary block diagram 600 of jitter minimizing buffers 404 and 406 according to various embodiments of the invention is illustrated in FIG. 6. Input stage 608 accepts differential input signals $INPUT_P$ and $INPUT_N$. Input stage 608 is substantially decoupled from power supply $V_{DD}$ through the operation of decoupler 606. Additionally, output signals $OUTPUT_P$ and $OUTPUT_N$ are substantially dependent upon current signals $I_P$ and $I_N$, respectively, as opposed to top rail supply $V_{DD}$. Thus, buffer 600, through the combined operation of decoupler 606 and input stage 608, substantially isolates the data path from $V_{DD}$ power supply noise.

Current bias 602 generates a reference current, which is used by current mirror 604 and bias 614 to provide appropriate current and bias voltage signals for decoupler 606, clamp 612, and load 610. The current and bias voltage signals are substantially independent of performance variation due to: die location; power supply variation; and temperature variation. Accordingly, buffer 600 provides "drop in" capability into any number of exemplary processes, such as CMOS or bipolar-CMOS, with substantially constant results. In addition, startup 616 insures substantially unconditional startup of current bias 602 in any power on configuration.

Load 610 provides active loading for input stage 608 to generate output signals $OUTPUT_P$ and $OUTPUT_N$. Active load 610 provides voltage controlled resistance functionality, which substantially reduces the need for resistive components. Accordingly, active load 610 facilitates enhanced precision by substantially reducing the need to mix resistive components with MOS components, thus creating a more robust design. Clamp 612 provides over-voltage protection to load 610 to prevent damaging voltage levels from being applied to the thin oxide devices contained within load 610.

Figure 7:
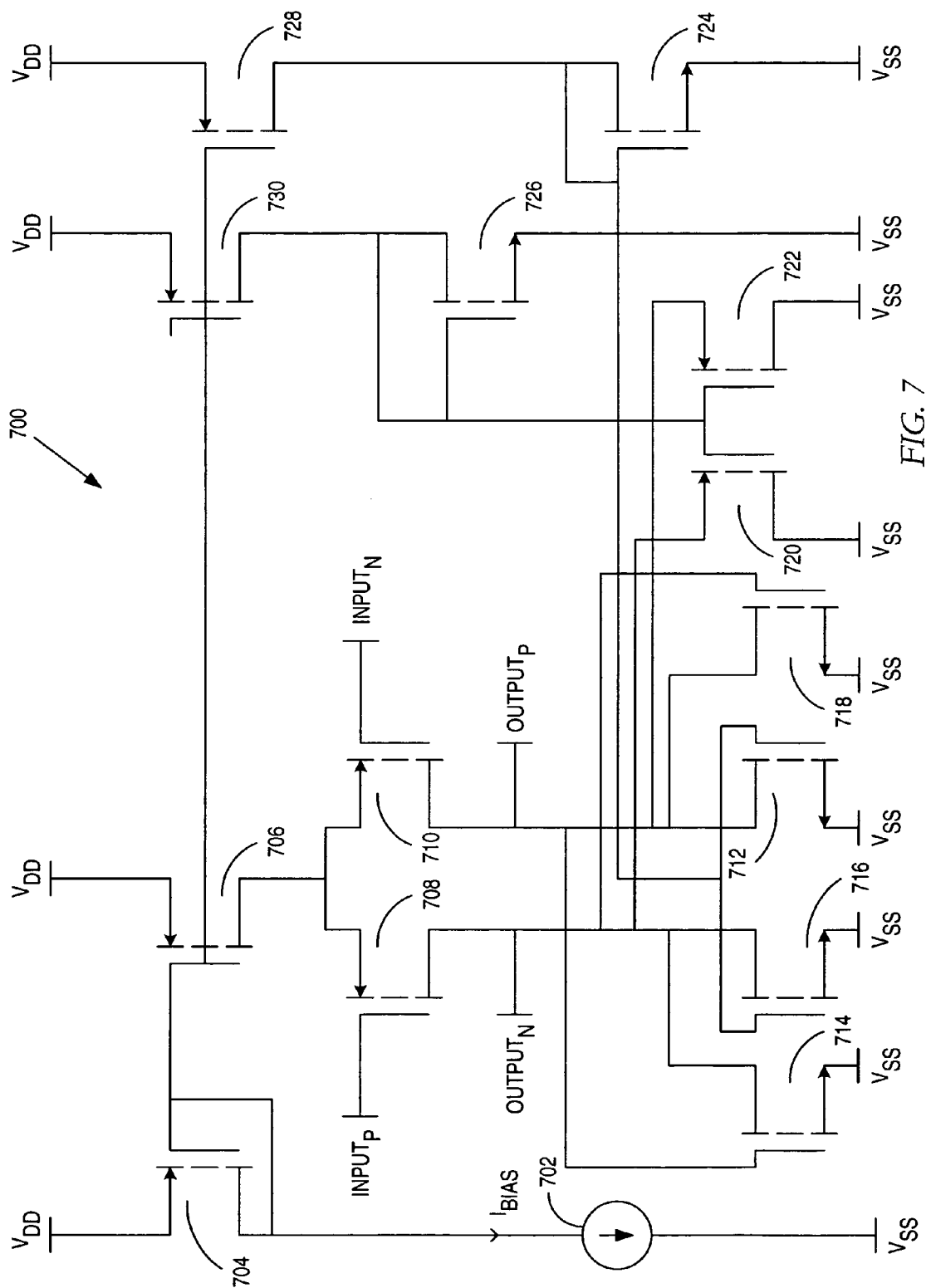
FIG. 7 illustrates an exemplary schematic of the block diagram of FIG. 6.
Figure 8:
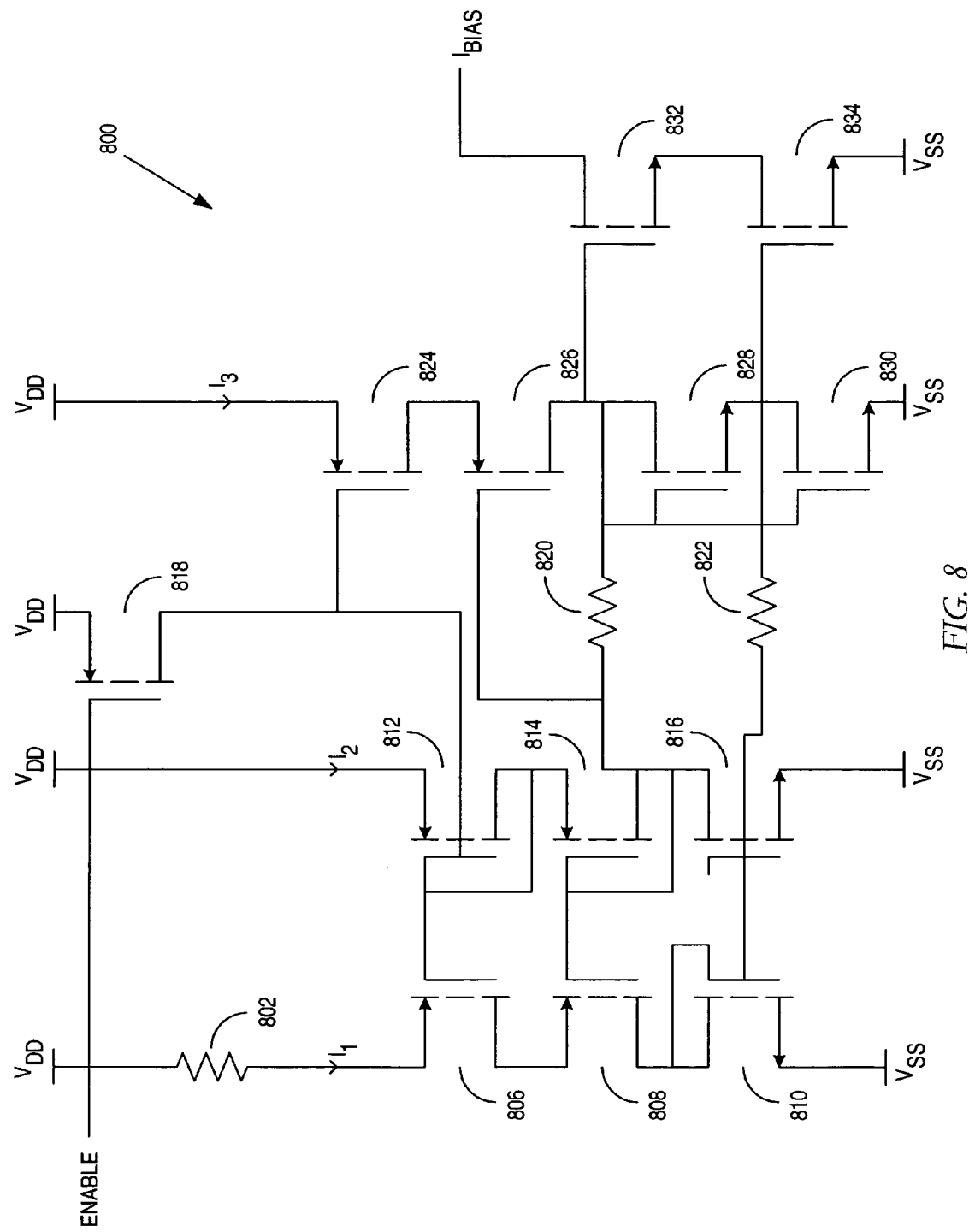
FIG. 8 illustrates an exemplary schematic of the current bias block of FIG. 6 in accordance with the various embodiments of the invention.

Schematic diagram 700 of FIG. 7 provides an exemplary implementation of buffer 600 in accordance with various embodiments of the invention. Current source 702 represents, for example, current bias 602 of FIG. 6 and is implemented as a temperature compensated current source supplying $I_{BIAS}$ as shown. Diode connected transistor 704 provides commonly connected drain and gate terminals to a first conductor of Proportional to Absolute Temperature (PTAT) current bias 702. The source terminal of transistor 704 is coupled to the top rail power supply, $V_{DD}$. A second conductor of PTAT current bias 702 is coupled to bottom rail power supply, $V_{SS}$.

The gate terminals of transistors 704, 706, 730, and 728 are commonly connected and each of their respective source terminals are connected to $V_{DD}$. The drain terminal of transistor 730 connects to the drain terminal of transistor 726. The gate and drain terminals of diode connected transistor 726 are connected to the commonly connected gate terminals of transistors 720 and 722. The drain terminal of transistor 728 is coupled to the drain and gate terminals of diode connected transistor 724 at the commonly connected gate terminals of transistors 716 and 712. The source terminals of transistors 726 and 724 and the drain terminals of transistors 720 and 722 are connected to $V_{SS}$.

The drain terminal of transistor 706 (e.g., a P type transistor) is coupled to the commonly connected source terminals of transistors 708 and 710. The drain terminal of transistor 708 is coupled to the drain terminals of transistors 714 and 716, the gate terminal of transistor 718, and the source terminal of transistor 720 at node $OUTPUT_N$. The drain terminal of transistor 710 is coupled to the drain terminals of transistors 712 and 718, the gate terminal of transistor 714, and the source terminal of transistor 722 at node $OUTPUT_P$. The source terminals of transistors 714, 716, 712, and 718 are connected to $V_{SS}$.

Current $I_{BIAS}$ is mirrored by transistors 704, 706, 730, and 728 in ratio proportion to transistor 704. Each of transistors 706, 730, and 728 are forced to equivalent gate to source potentials, $V_{GS}$, through the voltage reference provided by transistor 704. Hence, the magnitude of current conducted by transistors 706, 730, and 728 is proportional to their respective geometry ratio to transistor 704. Bias voltages are generated by diode connected transistors 726 and 724 due to the mirrored current generated by current sources 730 and 728, respectively.

In operation, buffer 700 receives an input differential signal at nodes $INPUT_P$ and $INPUT_N$. The input differential signal may experience a wide voltage range, while the output signal voltage range at nodes $OUTPUT_P$ and $OUTPUT_N$ remains substantially uniform. For example, a large positive voltage excursion of signal $INPUT_P$ or $INPUT_N$ causes a non-conductive state to exist in transistors 708 and 710, respectively. One limitation to the positive excursion is that the input voltage should be limited such that the gate oxide of each device is not damaged. Similarly, once the negative excursion of signal $INPUT_P$ or $INPUT_N$ generates a gate to source voltage across transistors 708 or 710, respectively, that is less than the threshold of the devices, they will be rendered conductive. Any further negative excursion does not affect their conductive state, but may likewise be limited to prevent gate oxide damage.

Load transistors 716 and 712 are operating in the triode region and their respective gate to source potentials are fixed by the reference voltage provided by diode connected transistor 724. In a first phase of operation, transistor 708 (e.g., a P type transistor) is rendered minimally conductive by a logic high voltage level at node $INPUT_P$, and transistor 710 (e.g., a P type transistor) is rendered maximally conductive by a logic low voltage level at node $INPUT_N$. Accordingly, the amount of drain current, $I_{DHIGH}$, conducted by load 712 maximizes, thus causing the voltage level at node $OUTPUT_P$ to be equal to $V_{OUPUTP}=V_{SS}+V_{DS712HIGH}$, where $V_{DS712HIGH}$ is the maximized drain to source voltage across transistor 712 due to the maximized drain current flowing into transistor 712. The amount of drain current, $I_{DLOW}$, conducted by load 716, on the other hand, reduces to substantially zero.

In a second phase of operation, transistor 710 is rendered minimally conductive by a logic high voltage level at node $INPUT_N$, and transistor 708 is rendered maximally conductive by a logic low voltage level at node $INPUT_P$. Accordingly, the amount of drain current, $I_{DHIGH}$, conducted by load 716 maximizes, thus causing the voltage level at node $OUTPUT_N$ to be equal to $V_{OUTPUTN}=V_{SS}+V_{DS716HIGH}$, where $V_{DS716HIGH}$ is the maximized drain to source voltage across transistor 716 due to the maximized drain current flowing into transistor 716. The amount of drain current, $I_{DLOW}$, conducted by load 712, on the other hand, reduces to substantially zero.

It can be seen, therefore, that output signals $OUTPUT_P$ and $OUTPUT_N$ are both referenced to the bottom rail power supply $V_{SS}$. Further, output signals $OUTPUT_P$ and $OUTPUT_N$ are each dependent upon load current flow as opposed to top rail power supply voltage. Accordingly, output signals $OUTPUT_P$ and $OUTPUT_N$ are substantially isolated from top rail power supply noise.

Additionally, the gate to source voltage of transistor 706 maintains transistor 706 in a saturated state. As such, any drain to source voltage variation at transistor 706 caused by $V_{DD}$ noise, is substantially cancelled by transistor 706 because transistor 706 maintains a substantially constant drain current regardless of drain to source voltage variation.

Accordingly, the amount of noise coupled from $V_{DD}$ to transistor 706 drain current is minimized.

As discussed above, load devices 716 and 712 are biased in their respective ohmic, or triode region, such that the drain to source potential across load devices 716 and 712 is maintained to be less than $V_{GS}-V_t$, where $V_{GS}$ is the gate to source voltage and $V_t$ is the threshold voltage of each respective load device. In such a configuration, load devices 716 and 712 behave substantially as voltage controlled resistive elements, thus obviating the need to place passive resistive components in their place. Using active components as resistive elements facilitates a robust design by reducing the device type count, thus reducing process variation.

Transistors 714 and 718 (e.g., N-type transistors) are cross-coupled to output terminals $OUTPUT_P$ and $OUTPUT_N$, respectively, and thus accelerate the negative transitions of the signals at these terminals. If the voltage at the gate terminal of transistor 714, i.e., output node $OUTPUT_P$, gets high enough, for example, then transistor 714 becomes conductive and the output voltage at node $OUTPUT_N$ is accelerated to its output low value, $V_{OL}$. Conversely, if the voltage at the gate terminal of transistor 718, i.e., output node $OUTPUT_N$, gets high enough, then transistor 718 becomes conductive and the output voltage at node $OUTPUT_P$ is accelerated to its output low value, $V_{OL}$. Accordingly, less jitter is allowed to be added by virtue of the accelerated edge transitions.

Transistors 720 and 722 serve a clamping function to prohibit the voltage level at nodes $OUTPUT_N$ and $OUTPUT_P$, respectively, from becoming too large. Such a condition could potentially damage load devices 716 and 712 and/or cross-coupled devices 714 and 718. In normal operation, e.g., during first and second phases discussed above, transistors 720 and 722 are placed into a non-conductive state, since their source potentials never cause their respective gate to source voltages to be less than their respective thresholds.

If, however, the voltage level at node $OUTPUT_P$ causes the gate to source potential of transistor 722 to be less than the threshold of transistor 722, then transistor 722 is rendered conductive, thus clamping the voltage at node $OUTPUT_P$ to be equal to $V_{OUTPUTPCLAMP}=V_{SS}+V_{DS722}$, where $V_{DS722}$ is the drain to source potential of transistor 722.

If, on the other hand, the voltage level at node $OUTPUT_N$ causes the gate to source potential of transistor 720 to be less than the threshold of transistor 720, then transistor 720 is rendered conductive, thus clamping the voltage at node $OUTPUT_N$ to be equal to $V_{OUTPUTNCLAMP}=V_{SS}+V_{DS720}$, where $V_{DS720}$ is the drain to source potential of transistor 720.

Schematic diagram 800 illustrates an exemplary embodiment of current bias 702 according to various embodiments of the present invention. Current bias 800 exhibits PTAT operation to maintain $I_{BIAS}$ substantially constant over temperature. Additionally, current bias 800 exhibits substantially unconditional startup under any power on configuration.

A first conductor of PTAT resistive element 802 is connected to $V_{DD}$ and a second conductor of PTAT resistive element 802 is connected to the source terminal of transistor 806. The source terminal of transistor 808 is connected to the drain terminal of transistor 806. The gate terminal of transistor 806 is coupled to the gate and drain terminals of transistor 812, the gate terminal of transistor 824, the source terminal of transistor 814, and the drain terminal of transistor 818. The gate terminal of transistor 808 is coupled to the gate and drain terminals of transistor 814, the gate terminal of transistor 826, the drain terminal of transistor 816, and a first conductor of resistive element 820. The drain and gate terminals of transistor 810 are connected to the drain terminal of transistor 808, the gate terminal of transistor 816, and a first conductor of resistive element 822. The source terminals of transistors 810, 816, 830, and 834 are each connected to $V_{SS}$. The source terminals of transistors 812, 818, and 824 are connected to $V_{DD}$. Transistors 806, 808, and 814 each have their bulk nodes coupled to their respective source nodes.

The drain terminal of transistor 824 is connected to the source terminal of transistor 826. The drain terminal of transistor 826 is connected to the gate terminal of transistor 832, a second conductor of resistive element 820, the gate terminals of transistors 828 and 830, and the drain terminal of transistor 828. The source terminal of transistor 828 is connected to the drain terminal of transistor 830. The gate terminal of transistor 834 is coupled to a second conductor of resistive element 822. The drain terminal of transistor 834 is connected to the source terminal of transistor 832. The drain terminal of transistor 832 provides the $I_{BIAS}$ connection to current bias 800. Signal ENABLE is connected to the gate terminal of transistor 818.

In operation, current $I_1$ is substantially independent of temperature variation, due to the inverse PTAT relationship between PTAT resistive element 802 and transistor 806. In particular, resistive element 802 acts as a PTAT voltage source such that the voltage generated by resistive element 802 slightly increases with increasing temperature. Transistor 806, on the other hand, acts as an inverse PTAT device such that the drain current conducted by transistor 806 decreases with increasing temperature. Thus, the PTAT characteristics of resistive element 802 and transistor 806 combine to generate current $I_1$ that is substantially independent of temperature.

Transistors 810 and 816 operate to mirror current $I_1$, such that current $I_2$ is forced to be equal to current $I_1$ over temperature. In particular, current $I_1$ generates a reference voltage across diode connected transistor 810. Given that the geometries of transistor 816 and 810 are equivalent, current $I_2$ is forced to be equal to current $I_1$ because the gate to source voltages of transistors 810 and 816 are also equal.

Current bias 800 additionally provides substantially unconditional startup operation. An initial current path for $I_2$ is established through current bias 800 when power supply $V_{DD}$ becomes available, whereby current $I_2$ flows through transistor 812, transistor 814, resistive element 820, transistor 828, and transistor 830.

Once the initial current path for $I_2$ is established, a current path for current $I_1$ is established through resistive element 802, transistor 806, transistor 808, and transistor 810. The current flow through transistor 810 sets up the gate to source bias for transistor 816, which then allows current $I_2$ to flow through transistor 816.

Once current flows $I_1$ and $I_2$ are established, current $I_3$ through transistors 824, 826, 828, and 830 is established. At steady state, bias potentials are set up such that a minimal voltage drop across resistive element 820 exists. Thus, a negligible portion of currents $I_2$ and $I_3$ flow through resistive element 820 at steady state. Finally, transistors 832 and 834 are each biased to supply current $I_{BIAS}$ as required.

Various modifications and additions can be made to the preferred embodiments discussed herein above without departing from the scope of the present invention. Accordingly, the scope of the present invention should not be limited by the particular embodiments described above, but should be defined only by the claims set forth below and equivalents thereof.

What is claimed is:

1. A buffer, comprising:
   a current source coupled to provide a current signal substantially independent of temperature variations;
   a bias circuit adapted to provide a first bias signal in response to the current signal;
   a decoupler, responsive to the first bias signal and a first power supply signal, and adapted to provide a load signal that is substantially independent of noise present in the first power signal; and
   an input stage coupled to receive the load signal as its supply reference, and adapted to provide an output signal that is substantially independent of the noise in the first power signal and the temperature variations.

2. The buffer according to claim 1, wherein the current source comprises:
   an inversely Proportional To Absolute Temperature (PTAT) element coupled to provide a decreasing PTAT current signal with increasing temperature; and
   a PTAT element coupled to receive the decreasing PTAT current signal and arranged to provide an increasing PTAT voltage signal with increasing temperature.

3. The buffer according to claim 2, wherein the current source further comprises a startup circuit adapted to provide a first current path prior to steady state operation of the buffer and a second current path subsequent to steady state operation of the buffer.

4. The buffer according to claim 1, wherein the bias circuit comprises a first current conduction device coupled to receive the current signal at a first node and coupled to provide the first bias signal at the first node.

5. The buffer according to claim 4, wherein the decoupler comprises a second current conduction device having a geometry in ratio proportion to the first current conduction device.

6. The buffer according to claim 5, wherein the second current conduction device includes a P-type Field Effect transistor having a source terminal coupled to receive the first power supply signal and a drain terminal coupled to provide the load signal.

7. The buffer according to claim 1, wherein the input stage comprises a differential transistor pair having conductors coupled to receive the load signal at a second node.

8. The buffer according to claim 7, wherein the differential transistor pair includes first and second P-type Field Effect transistors having a first drain terminal coupled to provide the output signal in response to a first phase of the input signal and a second drain terminal coupled to provide the output signal in response to a second phase of the input signal.

9. The buffer according to claim 8, further comprising active loads coupled to the first and second drain terminals, wherein a conductivity state of the active loads is referenced to a second bias signal generated in proportion to the current signal.

10. The buffer according to claim 9, further comprising a clamp circuit coupled to the active loads to prevent the output signal from exceeding a predetermined value, wherein a conductivity state of the clamp circuit is referenced to a third bias signal generated in proportion to the current signal.

11. The buffer according to claim 9, further comprising a cross-coupled circuit coupled to the active loads and the input stage to accelerate transitions of the output signal.

12. The buffer according to claim 11, wherein the cross-coupled circuit comprises:
   a first N-type Field Effect transistor having a control terminal coupled to the second drain terminal and a first conductor coupled to the first drain terminal; and
   a second N-type Field Effect transistor having a control terminal coupled to the first drain terminal and a first conductor coupled to the second drain terminal.

13. A buffer circuit, comprising:
   means for providing a current signal substantially independent of temperature variations;
   means for providing a first bias signal in response to the current signal;
   means, responsive to the first bias signal and a first power supply signal, for providing a load signal that is substantially independent of noise present in the first power signal; and
   means, coupled to receive the load signal as its supply reference, for providing an output signal that is substantially independent of the noise in the first power signal and the temperature variations.

14. The buffer circuit according to claim 13, further comprising means for clamping the output signal to a predetermined level.

15. The buffer circuit according to claim 14, further comprising means for accelerating transitions of the output signal.

16. A buffer adapted to operate substantially independently of temperature variations, and of power-supply, noise-induced jitter, the buffer comprising:
   a current generator adapted to generate a current bias substantially independent of temperature variation;
   a bias generator coupled to receive the current bias and coupled to the first power supply to produce a bias signal;
   a decoupler coupled to receive the bias signal, wherein the bias signal renders a conductivity state of the decoupler to provide a load signal that is substantially independent of a first power supply level variation due to noise;
   a differential transistor pair coupled to receive first and second inputs and the load signal, wherein the load signal is conducted by the differential transistor pair in response to the first and second inputs; and
   a load circuit coupled to the differential transistor pair and coupled to provide a differential output signal at first and second nodes, the load circuit including:
      a cross coupled circuit coupled to the first and second nodes, wherein the cross coupled circuit decreases a negative transition time of the output signal at the first node in response to an increased conductivity state of the cross coupled circuit caused by the output signal at the second node.

* * * * *